(12) United States Patent
Gong et al.

(10) Patent No.: US 8,539,301 B2
(45) Date of Patent: Sep. 17, 2013

(54) MESSAGE-WISE UNEQUAL ERROR PROTECTION

(75) Inventors: Chen Gong, New York, NY (US); Guosen Yue, Plainsboro, NJ (US); Xiaodong Wang, New York, NY (US)

(73) Assignee: NEC Laboratories America, Inc., Princeton, NJ (US)

( * ) Notice: Subject to any disclaimer, the term of this patent is extended or adjusted under 35 U.S.C. 154(b) by 429 days.

(21) Appl. No.: 12/908,196

(22) Filed: Oct. 20, 2010

(65) Prior Publication Data

US 2011/0093760 A1    Apr. 21, 2011

Related U.S. Application Data

(60) Provisional application No. 61/253,680, filed on Oct. 21, 2009.

(51) Int. Cl.
*H03M 13/00* (2006.01)
(52) U.S. Cl.
USPC ........................................................ 714/753
(58) Field of Classification Search
USPC ........................................................ 714/758
See application file for complete search history.

(56) References Cited

U.S. PATENT DOCUMENTS

| | | | | | |
|---|---|---|---|---|---|
| 4,972,419 | A | * | 11/1990 | Burke | 372/2 |
| 5,521,856 | A | * | 5/1996 | Shiraishi | 708/628 |
| 5,559,462 | A | * | 9/1996 | Tanoi | 327/231 |
| 7,149,955 | B1 | * | 12/2006 | Sutardja et al. | 714/809 |
| 7,783,937 | B1 | * | 8/2010 | Sutardja et al. | 714/701 |
| 8,112,693 | B2 | * | 2/2012 | Kong et al. | 714/765 |
| 8,219,876 | B2 | * | 7/2012 | Radosavljevic et al. | 714/758 |
| 8,290,353 | B2 | * | 10/2012 | Fujimoto et al. | 386/356 |
| 2012/0017136 | A1 | * | 1/2012 | Ordentlich et al. | 714/763 |
| 2012/0131244 | A1 | * | 5/2012 | Abbasfar | 710/105 |

* cited by examiner

*Primary Examiner* — Amine Riad
(74) *Attorney, Agent, or Firm* — Joseph Kolodka

(57) ABSTRACT

Message-wise unequal error protection is provided using codeword flipping to separate special and ordinary codewords without discarding any codewords. Special messages are encoded to ensure the codeword weight is less than a certain threshold weight. Ordinary messages are encoded to ensure the codeword weight is greater than the threshold weight. The bits of the codeword are flipped to enforce the weight criterion. Ordinary and special messages are encoded using different encodings to provide different levels of error protection. Upon receipt, codewords are separated into special and ordinary codewords for appropriate decoding. If a codeword is of indeterminate type, it is iteratively processed as both a special codeword and an ordinary codeword. The decoding result of each process is periodically checked to determine which decoding result satisfies decoding criteria.

11 Claims, 5 Drawing Sheets

MESSAGE-WISE UNEQUAL ERROR PROTECTION

This application claims the benefit of U.S. Provisional Application No. 61/253,680, filed on Oct. 21, 2009, which is incorporated herein by reference.

FIELD OF THE INVENTION

The present invention is generally directed to coding and decoding using unequal error protection, and more particularly to the use of codeword flipping and signal inversion to distinguish message and codeword types in an message-wise unequal error protection scheme.

BACKGROUND

Unequal error protection (UEP) can be used to provide better error protection for certain messages relative to other messages. Current message-wise UEP schemes are based on optimal coding schemes, which are information theory-oriented and are not practically implemented or deployed.

SUMMARY OF THE INVENTION

In accordance with an embodiment, a message is encoded as a codeword using a first and second encoding. Specifically, in response to determining the message is a first message-type, a first-encoding is applied that results in the codeword having a weight less than or equal to a first threshold. In response to determining the message is not a first message-type, a second-encoding is applied that results in the codeword having a weight greater than the first threshold.

In accordance with one aspect of the present invention, if the message is a first message-type, the first-encoding represents the message as an all-zero binary sequence.

In accordance with a further aspect, the second-encoding applies a parity-check encoding to the message, and if the weight of the codeword is less than the threshold, each bit of the codeword is flipped. In yet a further aspect, the first-encoding applies a parity-check encoding to the message, and if the weight of the codeword is greater than the threshold, each bit of the codeword is flipped.

In accordance with a further embodiment, a received signal is determined to be a first message-type or a second message-type. If the received message is a first message-type, the special message is output. If the received message is a second message-type, decoding inverts the codeword in the received signal, in response to determining bits of the codeword have been flipped, and applies a parity-check decoding to the codeword.

In yet a further aspect of an embodiment, if the received signal is of a first message-type a first-decoder can invert the codeword in response to determining bits of the codeword have been flipped, and applying a parity-check decoding to the codeword. If the codeword cannot be identified as encoding a message of the first message-type or a message of the second message-type, the first-decoding and second decoding are applied separately to the received codeword. If a metric of the first-decoder falls below a first threshold, the first result is output. If a metric of the second-decoder falls below the first threshold, the second result is output.

These and other advantages of the invention will be apparent to those of ordinary skill in the art by reference to the following detailed description and the accompanying drawings.

DETAILED DESCRIPTION

In accordance with an embodiment of the present invention, practical coding and decoding schemes for message-wise unequal error protection (UEP) is provided in combination with low-density parity-check (LDPC) coding schemes.

As discussed herein, UEP generally utilizes codeword flipping (i.e., flipping all the bits in a codeword $\{0\to 1, 1\to 0\}$) to distinguish between two message types, such as special messages and ordinary messages.

Some systems, one or some messages that should be more protected than others and can be referred to as special messages (e.g., the message of emergency or some control messages). Other messages (e.g., ordinary messages) require a lesser level of protection. For example, ordinary messages can be encoded using a first capacity-approaching code (e.g. LDPC codes). The weight of the codeword is then determined, and for any codeword having a weight not satisfying predetermined criteria, the bits of the codeword are flipped. The weight of the codeword is the number of bits set to "1." In one embodiment the predetermined criteria is having a weight smaller than half the codeword length. Special messages can be encoded using a second capacity-approaching code. For each special message codeword having a weight greater than half the codeword length, the codeword bits are flipped. Further details are discussed below with respect to the figures.

The performance of the processes and systems described herein provides capacity-approaching performance (i.e., the coding schemes can approach the performance limit for UEP dictated by the information theory) with low complexity (i.e., the coding adds little complexity to existing LDPC coding and is easily implemented in systems where the LDPC coding schemes have been implemented).

Figure 1:
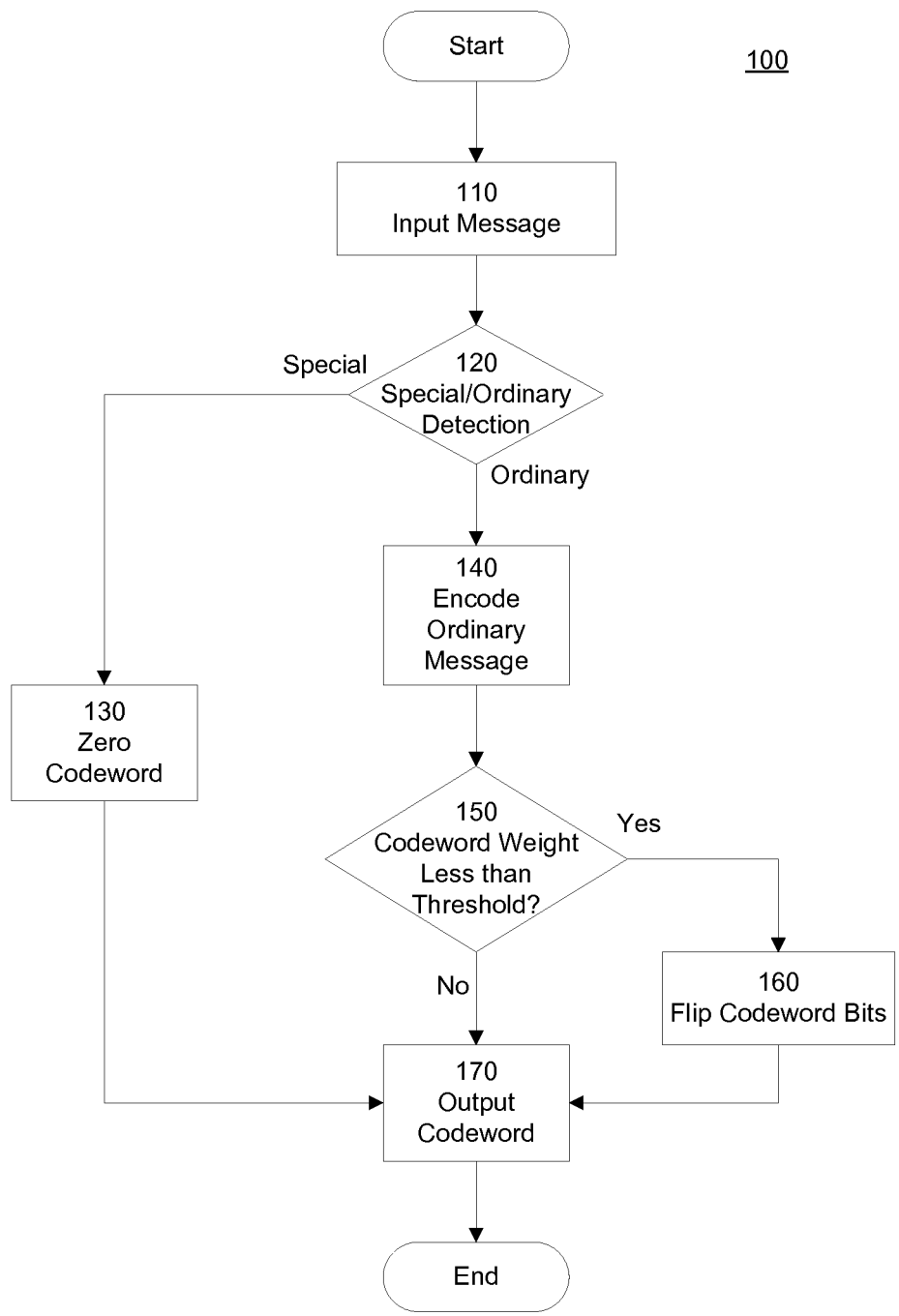
FIG. 1 is a flow chart of a process for encoding a message in accordance with an embodiment that assumes only one special message exists.

FIG. 1 illustrates a flow chart of a process 100 for encoding a message in accordance with an embodiment that assumes only one special message exists. That is, while there are many ordinary messages, only one special message exists. The message to be coded is input at 110. At decision 120 it is determined whether the message is special or ordinary. If the message is special, at step 130, the message is encoded to an all zero codeword. The all zero codeword is then output at step 170.

If the message is "ordinary," at step 140, the message is encoded using one capacity-approaching code. At decision 150 it is determined whether the codeword has a weight (W) less than a certain threshold (e.g., the half the length (N) of the codeword (W<N/2)). If the weight is less than the threshold, the bits of the codeword are flipped at step 160. The resulting coded ordinary message is then output at step 170.

Figure 2:
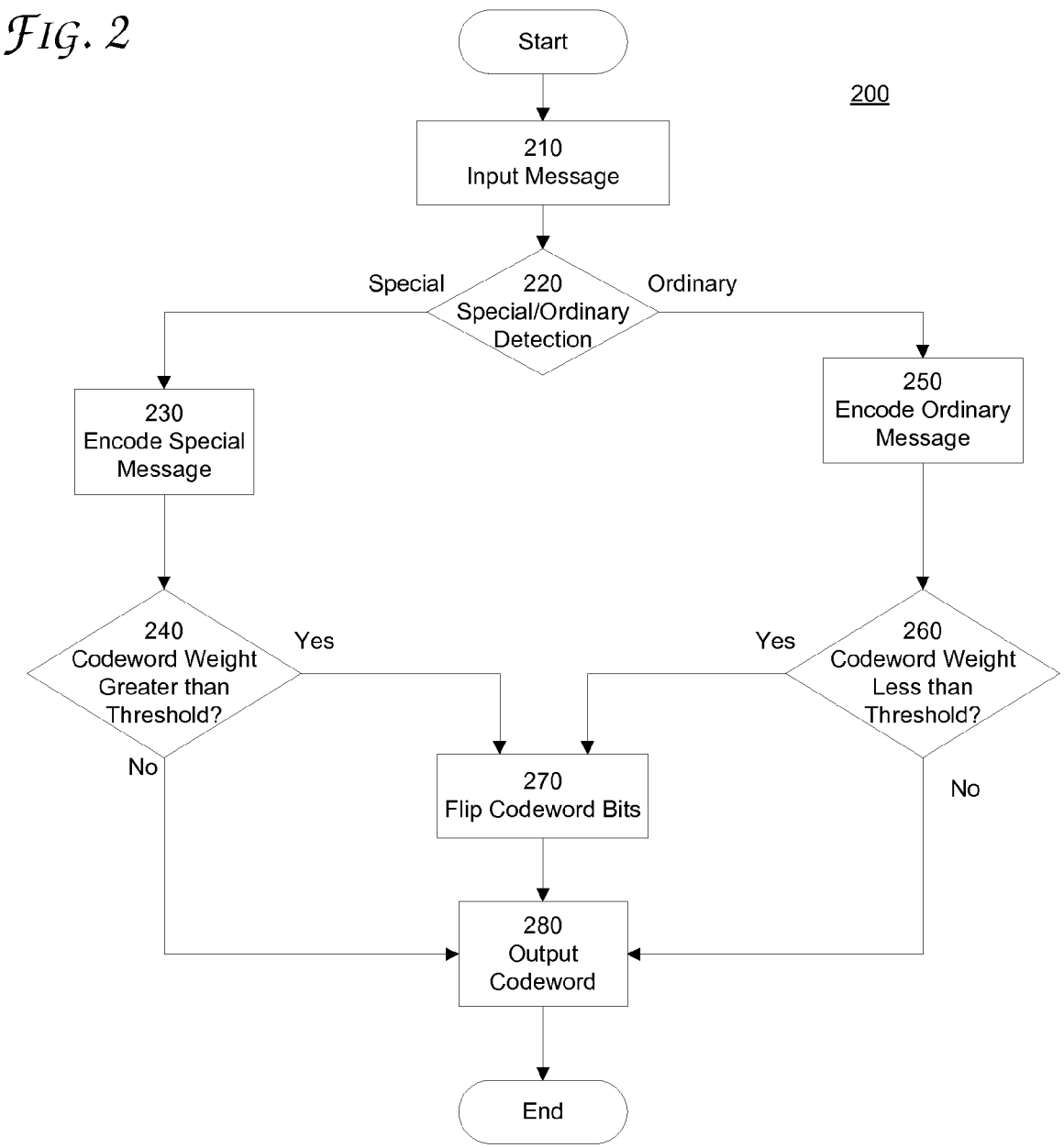
FIG. 2 is a flow chart of a process for encoding a message in accordance with an embodiment having multiple special messages.

FIG. 2 illustrates a flow chart of a process 200 for encoding a message in accordance with an embodiment having multiple special messages. As similarly discussed above with respect to process 100, the message to be coded is input at 210. At decision 220 it is determined whether the message is special or ordinary.

If the message is special, at step 230, the message is encoded using a first capacity approaching code (e.g., one LDPC code). At decision 240, it is determined whether the weight of the codeword is greater than a threshold. If it is, the codeword bits are flipped at step 270. The codeword is then output at step 280.

If the message is "ordinary," at step 250, the message is encoded using a second capacity-approaching code. The second capacity-approaching code can be different from the first capacity approaching code to provide different levels of error protection. At decision 260 it is determined whether the codeword has a weight (W) less than the threshold. If the weight is less than the threshold (e.g., N/2), the bits of the codeword are flipped at step 270. The resulting coded ordinary message is then output at step 280.

In accordance with a further aspect, the LDPC codes used have all odd degree check nodes. For a binary code, binary summation of two codewords will result in another codeword of this code. Thus, codeword flipping can be viewed as binary summation of the codeword (to be flipped) and an all-one sequence. If the all-one sequence is a codeword of this code, then the decoder cannot detect if the codeword is the original codeword sequence or the one got flipped since both are valid codeword. With at least one odd degree check node in an LDPC code, the all-one sequence will not be a valid codeword for this LDPC code (the constraints of the odd check nodes are not satisfied with all one inputs.) The decoder at the receiver may differentiate the original codeword or flipped codeword. With all odd check nodes, the decoder can differentiate these two types (original or flipped) with the highest reliability. On the other hand, with such restrictions (having all odd check nodes), the LDPC codes have almost no performance degradation than that without such constraint. Process 200 ensures that all special codewords have a weight less than a threshold and all ordinary messages (coded) have a weight greater than a threshold. Thus, based on this knowledge, received codewords can be differentiated as special or ordinary based on the weight of the codeword, and the appropriate decoder can be applied based on the determination of special or ordinary.

Figure 3:
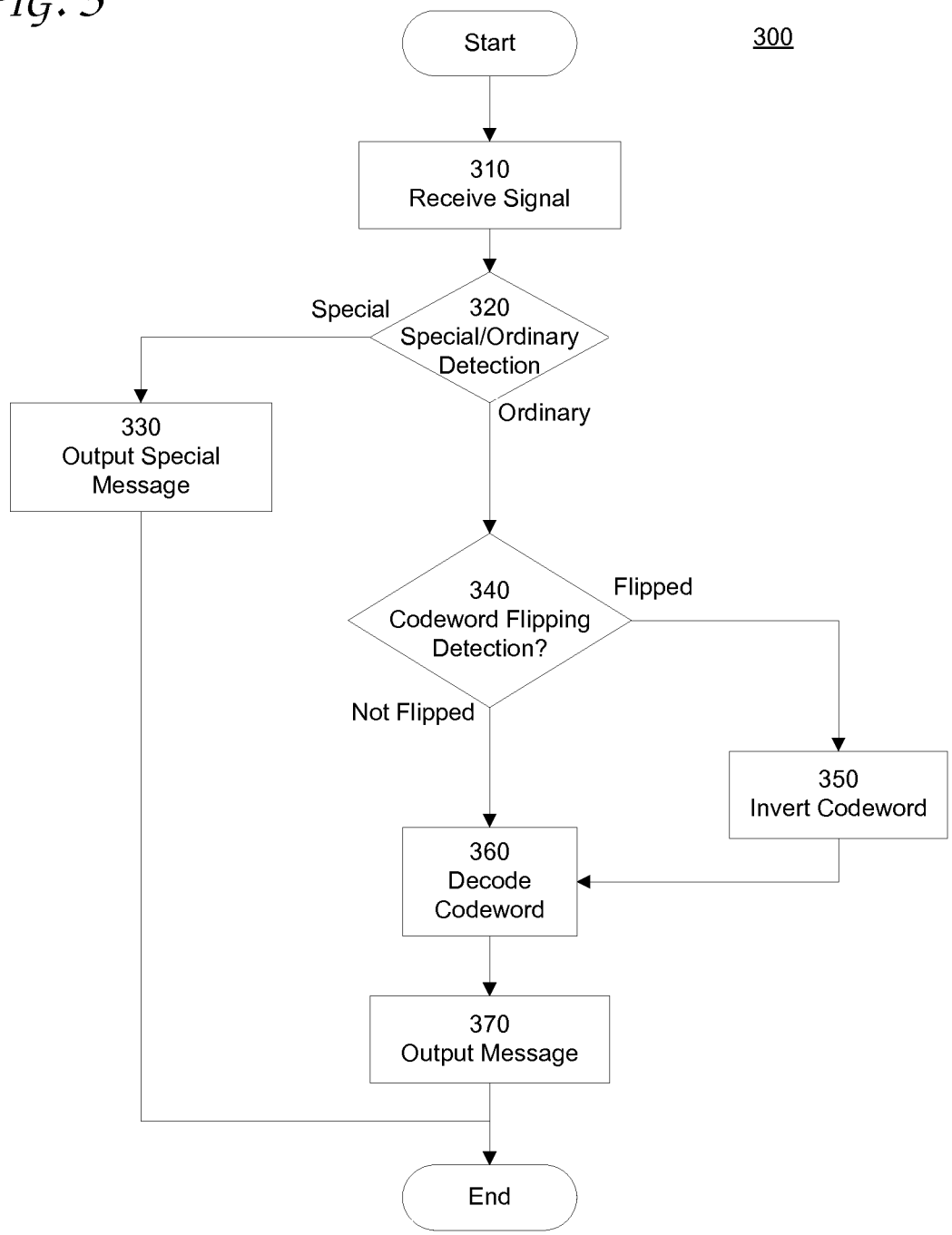
FIG. 3 is a is a flow chart of a process for decoding a codeword in accordance with an embodiment that assumes only one special message exists.

FIG. 3 illustrates a process 300 for decoding received signals encoded using unequal error protection that assumes only a single special message. A signal is received at step 310. The received signal is modeled as the modulated coded sequence transmitted through (or corrupted by) a certain channel, e.g., Binary Symmetric Channel (BSC) or Additive White Gaussian Noise Channel (AWGNC). At step 320 the average codeword weight is determined, for example using the average signal received from BSC or AWGNC.

If a special codeword is detected, at step 330, the single special message is output. However, if an ordinary codeword is detected at decision 320, at decision 340, it is determined whether the codeword has been flipped (i.e., whether during encoding, the bits of the codeword were flipped). If the codeword was flipped, at step 350, the codeword is inverted. At step 360, the codeword is then decoded into a message using the corresponding decoder (e.g., an iterative LDPC decoder), and the message is output at step 370.

Codeword inversion at step 350 changes the sign (i.e., + or −) of the received signal. For example, for AWGNC, the binary phase shift keying (BPSK) modulation maps as follows: $\{0 \rightarrow +1, 1 \rightarrow -1\}$. Thus, an all zero codeword is mapped to an all-one BPSK signal. Inverting an all-one BPSK signal would change the signs of the detected signals to an all-negative-one signal.

The determination of a special or ordinary codeword at step 320 is based on the type of signal encoding. For example, with respect to BSC, assuming the received sequence to be $c_i$ for $1 \leq i \leq N$, if the average code weight, which can express as $$\bar{c} = \frac{1}{N} \sum_{i=1}^{N} c_i,$$

is smaller than $$\frac{1}{2} - \varepsilon_B$$

for some small $\varepsilon_B$, it is determined a special codeword is detected, otherwise an ordinary codeword is detected. In a further example, with respect to AWGNC signal coding with BPSK, assuming the received signals to be $s_i$ for $1 \leq i \leq N$, if the average signal, which can be expressed as $$\bar{s} = \frac{1}{N} \sum_{i=1}^{N} s_i,$$

is larger than some $\varepsilon_G$, then the special codeword is detected; otherwise the ordinary codeword is detected.

The thresholds $\varepsilon_B$ and $\varepsilon_G$ for detecting the special message are typically chosen to meet a certain requirement on either the miss detection probability $p_{md}$ or false alarm probability $p_{fa}$.

For the BSC, when the all-zero sequence is transmitted, $$N\bar{y} = \sum_{i=1}^{N} y_i$$

is the sum of N independent Bernoulli (i.e., Bern(p)) random variables and therefore has a binomial distribution. The mean and variance of $\tilde{y}$ are p and $\sqrt{p(1-p)/N}$, respectively. By the central limit theorem, for large N, the distribution of $\tilde{y}$ is well approximated by Gaussian, i.e., $$\bar{y} \sim \mathcal{N}\left(p, \frac{p(1-p)}{N}\right).$$

Then for the given threshold $\varepsilon_B$, the miss detection probability can be approximated by $$p_{md}^B \cong Q\left(\frac{0.5 - \varepsilon_B - p}{\sqrt{p(1-p)}} \sqrt{N}\right),$$

where $$Q(x) = \frac{1}{\sqrt{2\pi}} \int_x^{+\infty} e^{-t^2/2} dt.$$

On the other hand, for the BIAWGN channel, when the all-1 sequence is transmitted, $\bar{y} \sim \mathcal{N}(1, \sigma^2/N)$. Hence the miss detection probability is given by $$p_{md}^G = Q\left(\frac{1-\epsilon_G}{\sigma}\sqrt{N}\right).$$

If the weight spectrum of the ordinary code Co, is denoted as $\{A_i\}$, where Ai is the fraction of weight-i codeword. The false alarm probability is then given by $$p_{fa} = \sum_i A_i p_{fa}(i),$$

where $p_{fa}(i)$ is the false alarm probability corresponding to the weight-i ordinary codeword.

First considering the BSC, it is assumed $\mu_{\tilde{y}}(i)$ and $$\sigma_{\tilde{y}}^2$$

denote the mean and variance of $\tilde{y}$ respectively, given that the weight of the message codeword is i. Note that if $i<N=2$, then the codeword is first flipped before being transmitted and hence the actual weight of the sequence is N−i. Thus, $$\mu_{\tilde{y}}(i) = \begin{cases} 1 - p + (2p-1)i/N, & i < N/2 \\ p + (1-2p)i/N, & i \geq N/2, \end{cases}$$

and $$\sigma_{\tilde{y}}^2 = \frac{p(1-p)}{N}.$$

Again by invoking the Gaussian approximation, $$p_{fa}^B(i) \cong Q\left(\frac{\mu_{\tilde{y}}(i) - 1/2 + \epsilon_B}{\sigma_{\tilde{y}}}\right).$$

On the other hand, for the BIAWGN channel, by taking into account codeword flipping, it follows that $\bar{y} \sim \mathcal{N}(-|N-2i|/N, \sigma^2/N)$, given that the message codeword has a weight i. Thus, $$p_{fa}^G(i) = Q\left(\frac{\sqrt{N}\epsilon_G + |N-2i|/\sqrt{N}}{\sigma}\right).$$

The approximation given above depends on the weight spectrum, which is difficult to compute for long LDPC codes. Fortunately, for long LDPC codes since almost all codewords are of the weight approximately equal to N=2, the false alarm probability can be further approximated as follows $$p_{fa} \cong p_{fa}(N/2),$$

where $p_{fa}(N/2)$ is derived from $p_{fa}^B(i)$ for the BSC and $p_{fa}^G(i)$ for the BIAWGN channel.

The determination of whether a codeword has been flipped, at decision 340, can be based on a prior soft log-likelihood ratio (LLR) messages (i.e., the LLR based on the received signal from channel before the decoding process, and a count of the number of unsatisfied check nodes based on the hard-decided (i.e., '0' or '1') bits. If M is assumed to be the number of check nodes, and $M_e$ to be the number of unsatisfied check nodes, if $M_e/M > \frac{1}{2}$ then the codeword flipping is detected, and the signs of the input a prior soft LLR messages are changed; otherwise the input a prior soft LLR messages is not changed.

Figure 4:
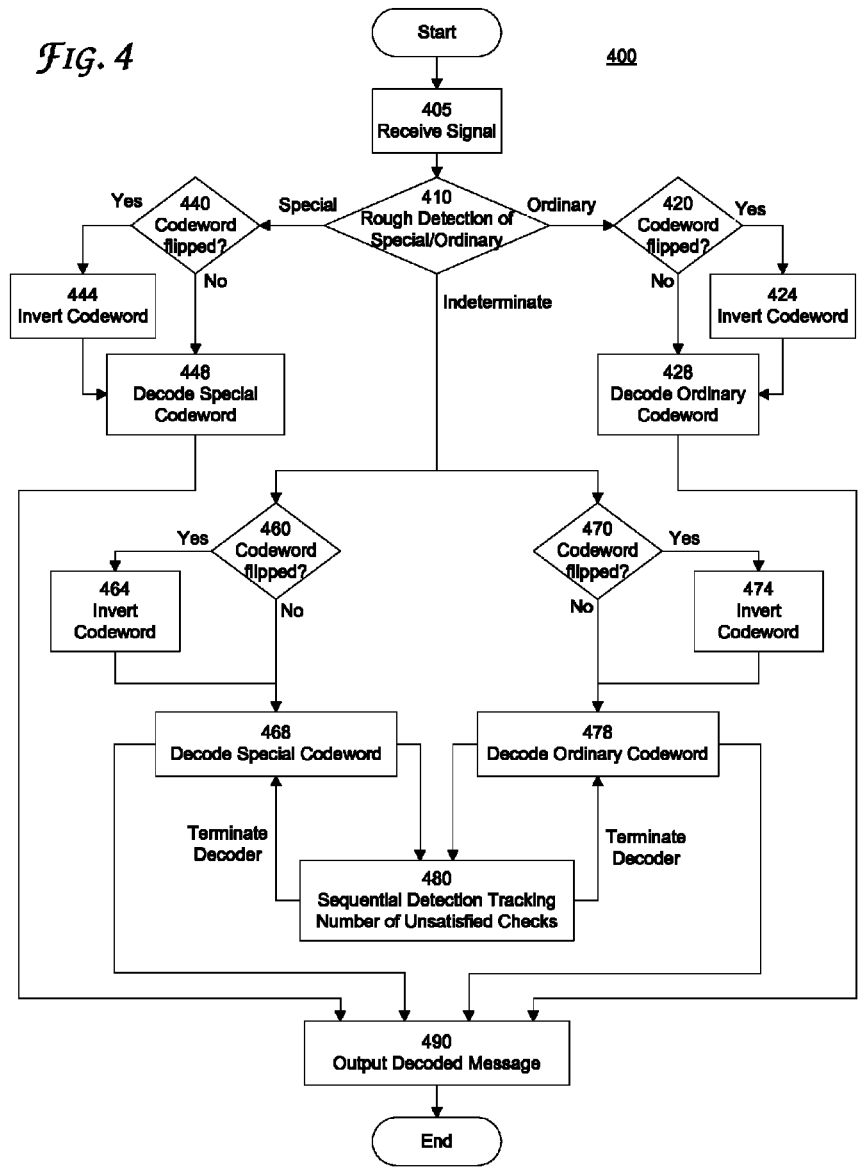
FIG. 4 is a flow chart of a process for decoding a codeword in accordance with an embodiment having multiple special messages.

FIG. 4 illustrates a process 400 for decoding a codeword in accordance with an embodiment having multiple special messages. At step 405, the signal is received and at decision 410 a rough detection is made as to whether the codeword transmitted in the signal is an ordinary or special message.

Rough detection is signal coding dependent. For example, rough detection is based on the average code weight (i.e., $$\bar{c} = \frac{1}{N}\sum_{i=1}^N c_i\bigg)$$

for BSC and average signal (i.e., $$\bar{s} = \frac{1}{N}\sum_{i=1}^N s_i\bigg)$$

for AWGNC. For BSC, given some small $\epsilon$, if the average code weight $\bar{c}$ is smaller than $$\frac{1}{2} - \epsilon,$$

a special message is detected, but if the average code weight $\bar{c}$ is larger than $$\frac{1}{2} + \epsilon,$$

an ordinary message is detected. Otherwise, the further detection is made based on the sequential detection, which is discussed in further detail below. For AWGNC, if the average signal $\bar{s}$ is larger than $\epsilon$, a special message is detected, but if the average signal $\bar{s}$ is less than $-\epsilon$, an ordinary message is detected. Otherwise, the further detection is made based on the sequential detection.

If an ordinary message is detected, at decision 420, it is determined whether the codeword has been flipped. If the codeword was flipped, the codeword is inverted at step 424. At step 428, the special message is decoded using the appropriate decoder, and the decoded message is output at step 490.

If a special message is detected, at decision 440, it is determined whether the codeword has been flipped. If the codeword was flipped, the codeword is inverted at step 444.

At step 448, the special message is decoded using the appropriate decoder, and the decoded message is output at step 490.

However, if at decision 410, it cannot be determined whether the codeword is a special message or an ordinary message, the codeword is processed as both an ordinary codeword and a special codeword. Thus, at decision 460, processing of the message as a special message begins, and at decision 470, processing of the message as an ordinary message begins. Processing as both an ordinary message and a special message can be performed in parallel or in an alternating iterative sequence.

With respect to processing the codeword as a special message, at decision 460, it is determined whether the codeword has been flipped. If the codeword was flipped, the codeword is inverted at step 464. At step 468, the special message is decoded using the appropriate decoder.

With respect to processing the codeword as an ordinary message, at decision 470, it is determined whether the codeword has been flipped. If the codeword was flipped, the codeword is inverted at step 474. At step 478, the ordinary message is decoded using the appropriate decoder.

At step 480, the output from the special message decoder of step 468 and the output of the ordinary message decoder at step 478 is received by a tracker that tracks the number of unsatisfied check nodes for the output of each decoder to sequentially detect whether the codeword is an ordinary message or a special message. That is, the decoding at steps 468 and 478 can be performed iteratively. After each iteration, the output is processed at step 480 to determine the number of unsatisfied check nodes in the LDPC decoding. If the number of unsatisfied check nodes for a given decoder (i.e., the special message decoder or the ordinary message decoder) exceeds half of the number of check nodes, the codeword is inverted for the next decoding iteration at the corresponding decoder. However, if in some iteration the fraction of unsatisfied check nodes for either the special decoder or the ordinary decoder meets a specified metric (e.g., falls below some threshold η, such as ⅙), the codeword can be classified as a special or ordinary codeword, respectively. If the specified criteria are not satisfied after a given number of iterations, a decoding failure is declared.

It should be noted that in contrast to cavity encoding that mixes the special codewords and ordinary codewords together and discards the ordinary codewords near the special codewords, the above processes utilize codeword flipping to separate the special and ordinary codewords without discarding any codewords.

Message-wise UEP techniques can be extended to AWGN channels employing M-QAM with $M=2^{b1+b2}$, for exampled by using the natural bit-to-symbol mapping, where the first b1 and last b2 labeling bits of each signal point indicate its column and row indices, respectively. Assume $M1=2^{b1}$ and $M2=2^{b2}$. The reason for employing the natural mapping is that the signal point (x, y) is flipped to (−x, −y) when the codeword is flipped, which facilitates the separation of the signals for special and ordinary messages. In the following, it is assumed that the constellation signal points are (2i−M1+1, 2j−M2+1) for $0 \leq I \leq M1$, 1 and $0 \leq j \leq M2-1$. An LDPC code of length N(b1+b2) and map the N(b1+b2) bits to N signal points in the constellation is employed.

A single special message is encoded to the all-zero sequence, and the ordinary messages are encoded using a capacity-approaching LDPC code with all-odd degree check nodes. Let s(k) be the constellation signal points, $0 \leq k \leq M-1$, where s(0) is the signal point for the all-zero labeling bits. Note that the encoded symbols for ordinary messages are uniformly distributed over all signal points in the constellation. Thus for the encoded symbol sequence $x_1, \ldots, x_N$, define $$L_u \triangleq \frac{1}{MN} \sum_{i=1}^{N} \sum_{k=0}^{M-1} \|x_i - s^{(k)}\|^2$$

as the average distance between the encoded sequence and the uniform constellation distribution.

Further, for the special message, define $$L_s \triangleq \frac{1}{N} \sum_{i=1}^{N} \|x_i - s^{(0)}\|^2$$

as the average distance between the encoded sequence and the special message symbol sequence. Let $x^I_i$ and $x^Q_i$ be the in-phase (I) and quadratic (Q) components of the encoded symbols, respectively. Define $$\bar{x}^I \triangleq 1/N \sum_{i=1}^{N} x_i^I \text{ and } \bar{x}^Q \triangleq 1/N \sum_{i=1}^{N} x_i^Q.$$

The codeword is flipped if $L_s < L_u$ which is equivalent to $\bar{x}^I + \bar{x}^Q > K$ for some K determined from $L_s$ and $L_u$. The rational behind this is that, if one encoded sequence is closer to the encoded sequence for special message than the encoded sequences for ordinary messages, it should be flipped to be closer to those for ordinary messages. The above scheme is a natural generalization of that for the binary case. Note that when the signal constellation is {+1,−1}, the above flipping condition becomes $$L_u = \frac{1}{2N} \sum_{i=1}^{N} ((x_i + 1)^2 + (x_i - 1)^2) < \frac{1}{N} \sum_{i=1}^{N} (x_i - 1)^2 = L_s$$

At the decoder, the special codeword is detected if $$\frac{1}{N} \sum_{i=1}^{N} \|y_i - s^{(0)}\|^2 < \frac{1}{MN} \sum_{i=1}^{N} \sum_{k=0}^{M-1} \|y_i - s^{(k)}\|^2 - \lambda$$

for some λ. Denote the I and Q components of the received signals as $y^I_1$ and $y^Q_1$, $1 \leq i \leq N$, respectively. Define $$\bar{y}^I \triangleq 1/N \sum_{i=1}^{N} y_i^I \text{ and } \bar{y}^Q \triangleq 1/N \sum_{i=1}^{N} y_i^Q.$$

Then the condition above is equivalent to the following $$\bar{y}^I + \bar{y}^Q > \epsilon_{QAM},$$

for some threshold $\epsilon_{QAM}$. If the ordinary message is detected, the codeword flipping detection is performed in the same way as that for the binary case.

The miss detection and false alarm probabilities can be evaluated as follows. Assume the signal point for special message be (s(0I), s(0Q)). If the special message is sent, the average of received signals $\bar{y}^I$ and $\bar{y}^Q$ satisfy the distribution $\mathcal{N}(s^{(OI)}, \sigma/\sqrt{N})$ and $\mathcal{N}(s^{(OQ)}, \sigma/\sqrt{N})$, and the sum $\bar{y}^I$ and $\bar{y}^Q$ satisfies the distribution $\mathcal{N}(s^{(OI)}+s^{(OQ)}, 2\sigma/\sqrt{N})$. Thus, the miss detection probability is given by $$p_{md} = Q\left(\frac{s^{(OI)} + s^{(OQ)} - \epsilon_{QAM}}{2\sigma}\sqrt{N}\right).$$

The false alarm probability can be approximated by ignoring the weight distribution of the code employed and assume that the symbols in each encoded sequence are uniformly distributed over all constellation points. Then $\bar{\chi}^I = \bar{\chi}^Q = 0$, and $\bar{y}^I$ and $\bar{y}^Q$ satisfy the distribution $$\mathcal{N}(0, 2\sigma/\sqrt{N}).$$

Thus, the false alarm probability can be approximated by $$p_{fa} \cong Q\left(\frac{\epsilon_{QAM}}{2\sigma}\sqrt{N}\right).$$

The encoding scheme for multiple special messages is a natural generalization of that for the binary case. For the binary case, for the coded sequence $x_i (1 \leq I \leq N)$, the average of the coded symbols $$\bar{x} = 1/N \sum_{i=1}^{N} x_i$$

is larger than 0 for special messages and smaller than 0 for ordinary messages. The coded symbols for the ordinary and special messages dwell in the regions given by $\bar{\chi}^I + \bar{\chi}^Q \geq 0$ and $\bar{\chi}^I + \bar{\chi}^Q \leq 0$ respectively. Thus, the encoding scheme is as follows. For special messages, the codeword is flipped if $\bar{\chi}^I + \bar{\chi}^Q < 0$, and for ordinary messages, it is flipped if $\bar{\chi}^I + \bar{\chi}^Q > 0$.

At the decoder, a first-stage detection of message type is made. A special message is detected if $\bar{y}^I + \bar{y}^Q > \eta_{QAM}^s$ and an ordinary message is detected if $\bar{y}^I + \bar{y}^Q < -\eta_{QAM}^o$. If the message type is not detected, then during the second stage detection the special and ordinary message decoders run in parallel, flip the codewords if necessary, and track the number of unsatisfied check nodes in iterative decoding. The message type detection scheme is similar to that for the case of binary input, i.e., if the fraction of unsatisfied check nodes for one code becomes very small then decoding of the other is terminated.

Figure 5:
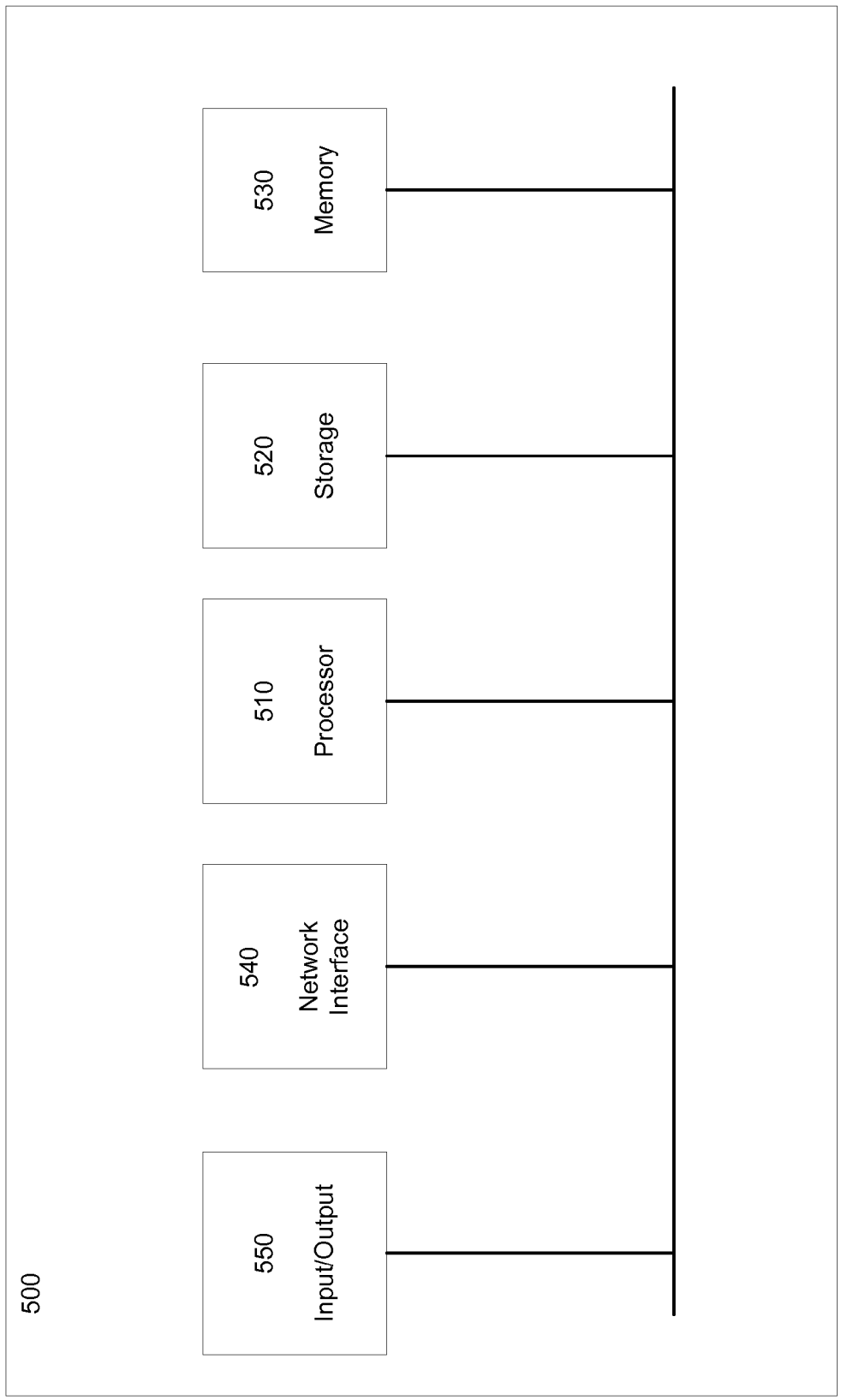
FIG. 5 is a high-level diagram of a computer that can be configured to perform a process in accordance with the present invention.

The above-described methods for coding and decoding using unequal error protection can be implemented on a computer using well-known computer processors, memory units, storage devices, computer software, and other components. A high-level block diagram of such a computer is illustrated in FIG. 5. Computer 500 contains a processor 510, which controls the overall operation of the computer 500 by executing computer program instructions, which define such operations. The computer program instructions may be stored in a storage device 520, or other computer readable medium (e.g., magnetic disk, CD ROM, etc.), and loaded into memory 530 when execution of the computer program instructions is desired. Thus, the method steps of FIGS. 1, 2, 3, and 4 can be defined by the computer program instructions stored in the memory 530 and/or storage 520 and controlled by the processor 510 executing the computer program instructions. For example, the computer program instructions can be implemented as computer executable code programmed by one skilled in the art to perform an algorithm defined by the method steps of FIGS. 1, 2, 3, and 4. Accordingly, by executing the computer program instructions, the processor 510 executes an algorithm defined by the method steps of FIGS. 1, 2, 3 and 4. The computer 500 also includes one or more network interfaces 540 for communicating with other devices via a network. The computer 500 also includes input/output devices 550 that enable user interaction with the computer 500 (e.g., display, keyboard, mouse, speakers, buttons, etc.) One skilled in the art will recognize that an implementation of an actual computer could contain other components as well, and that FIG. 5 is a high level representation of some of the components of such a computer for illustrative purposes.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention. The various functional modules that are shown are for illustrative purposes only, and may be combined, rearranged and/or otherwise modified.

We claim:

1. A method of decoding a codeword in a received signal as a message, the method comprising:
   in response to determining the codeword encodes a message of a first message-type, applying a first-decoding, comprising:
   outputting a special message;
   in response to determining the codeword encodes a message of a second message-type, applying a second-decoding comprising:
   inverting the codeword in the received signal, in response to determining bits of the codeword have been flipped, and
   applying a parity-check decoding to the codeword; and
   in response to failing to determine the codeword encodes one of a message of the first message-type or a message of the second message-type:
   applying the first-decoding to the codeword,
   applying the second-decoding to the codeword,
   outputting a result of the first-decoding, in response to determining a metric of the first-decoding is below a first threshold, and
   outputting a result of the second-decoding, in response to determining a metric of the second-decoding is below the first threshold.

2. The method of claim 1, wherein inverting the codeword comprises changing a sign of the received signal.

3. The method of claim 1, wherein applying the first-decoding further comprises:
   inverting the codeword in the received signal, in response to determining bits of the codeword have been flipped, and
   applying a parity-check decoding to the codeword.

4. The method of claim 1, wherein determination of the metric comprises determining a number of unsatisfied parity check nodes.

5. The method of claim 1, wherein, applying the first-decoding and applying the second-decoding are performed in parallel, in response to failing to determine the codeword encodes one of a message of the first message-type or a message of the second message-type.

6. The method of claim 1, wherein the first message-type comprises a special message, and the second message-type comprises and ordinary message.

7. A system for decoding a codeword in a received signal as a message, the system comprising:
    means for applying a first-decoding in response to determining the codeword encodes a message of a first message-type, the means for applying a first-decoding comprising means for outputting a special message;
    means for applying a second-decoding in response to determining the codeword encodes a message of a second message-type, the means for applying a second-decoding comprising:
        means for inverting the codeword in the received signal, in response to determining bits of the codeword have been flipped, and
        means for applying a parity-check decoding to the codeword; and
    means for processing a indeterminate codeword in response to failing to determine the codeword encodes one of a message of the first message-type or a message of the second message-type, the means for processing the indeterminate codeword comprising:
        means for applying the first-decoding to the codeword,
        mean for applying the second-decoding to the codeword,
        means for outputting a result of the first-decoding, in response to determining a metric of the first-decoding is below a first threshold, and
        means for outputting a result of the second-decoding, in response to determining a metric of the second-decoding is below a first threshold.

8. The system of claim 7, wherein the means for inverting the codeword comprises means for changing a sign of the received signal.

9. The system of claim 7, wherein the means for applying the first-decoding further comprises:
    means for inverting the codeword in the received signal, in response to determining bits of the codeword have been flipped, and
    means for applying a parity-check decoding to the codeword.

10. The system of claim 7, further comprising means for determining a number of unsatisfied parity check nodes, wherein the metric is the number of unsatisfied parity check nodes.

11. The system of claim 7, wherein the first message-type comprises a special message, and the second message-type comprises and ordinary message.

* * * * *